United States Patent
Felts, III et al.

(10) Patent No.: US 6,718,355 B2
(45) Date of Patent: Apr. 6, 2004

(54) SYSTEMS AND METHODS FOR A PARTIAL SUM DIGITAL FIR FILTER

(75) Inventors: Benjamin E. Felts, III, Cardiff, CA (US); Wilson Wang, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 595 days.

(21) Appl. No.: 09/777,622

(22) Filed: Feb. 5, 2001

(65) Prior Publication Data

US 2002/0138531 A1 Sep. 26, 2002

(51) Int. Cl.[7] .............................................. G06F 17/10
(52) U.S. Cl. ...................................................... 708/319
(58) Field of Search ......................................... 708/319

(56) References Cited

U.S. PATENT DOCUMENTS

| | | | |
|---|---|---|---|
| 5,831,879 A | * 11/1998 | Yom et al. ................... | 708/301 |
| 6,230,175 B1 | * 5/2001 | Okamoto et al. ........... | 708/319 |
| 6,301,596 B1 | * 10/2001 | Karanovic ................... | 708/319 |
| 6,308,190 B1 | * 10/2001 | Willson et al. ............. | 708/319 |
| 6,320,619 B1 | * 11/2001 | Jiang ........................... | 348/447 |

* cited by examiner

*Primary Examiner*—David H. Malzahn
(74) *Attorney, Agent, or Firm*—Procopio Cory Hargreaves & Savitch

(57) ABSTRACT

A digital FIR filter is provided that inputs a series of data samples $x[0] \ldots x[n]$ and generates a partial sum output $PS[i]$, where $i \leq n$. The partial sum output is a weighted version of the a difference between a partial sum of the previous $i-1$ data samples, $PS[i-1]$, and the current data sample $x[n]$ added to the current data sample $x[n]$. The filter includes a plurality of weighting stages. Each weighting stage includes a first adder for subtracting the current data sample $x[n]$ from the previous partial sum $PS[i-1]$, a multiplier that multiplies the difference by a weighting coefficient, and a second adder that sums the weighted difference with the current data sample. The filter also includes a plurality of delay elements, each of which inputs a partial sum and imposes a unit delay on the partial sum before supplying it to a weighting stage.

22 Claims, 13 Drawing Sheets

SYSTEMS AND METHODS FOR A PARTIAL SUM DIGITAL FIR FILTER

BACKGROUND OF THE INVENTION

1. Field of the Invention

The present invention relates generally to digital filters and, more particularly, relates to a partial sum digital FIR filter.

2. Background

In electrical systems, signals of interest are often corrupted by electrical noise and other forms of interference at unwanted frequencies. When this occurs, it is necessary to attenuate or eliminate the corrupting signals from the signal of interest. Electrical filters are used for this purpose. FIG. 1a depicts a basic filter 100. A desired signal 102 and an undesired signal 104 are combined to produce a signal 106 that is input to filter 100. Filter 100 suppresses the undesired signal portion of signal 106 and passes only the desired signal portion 108.

FIGS. 1b–1d illustrate some of the basic forms filters can take. FIG. 1b depicts a low pass filter 110. A desired low frequency signal 112 is combined with an undesired high frequency signal 114 to produce a signal 116 that is input to low pass filter 110. Low pass filter 110 passes only those signals having a frequency below a given cutoff frequency. Hence, filter 110 suppresses the undesired high frequency portion of combined signal 116 and passes only the desired low frequency signal 118.

FIG. 1c shows a high pass filter 120. An undesired low frequency signal 122 is combined with a desired high frequency signal 124 to produce a signal 126 that is input to high pass filter 120. High pass filter 120 passes only those signals having a frequency above a given cutoff. Hence, filter 120 suppresses the undesired low frequency portion of combined signal 126 and passes only the desired high frequency signal 128.

FIG. 1d portrays a bandpass filter 130. Only those signals whose frequencies fall within a given frequency band are passed by filter 130; signals whose frequencies are above or below the passband are attenuated. In this case, three signals 132, 134 and 136 are combined to produce a signal 138 that is input to bandpass filter 130. Signal 132 has a frequency below the passband of filter 130; signal 134 has a frequency within the passband of filter 130; and signal 136 has a frequency above the passband of filter 130. Hence, filter 130 suppresses the high and low frequency portions 132 and 134 of signal 138 and outputs a signal 139 containing only the signal 134 within the filter passband.

The filters of FIGS. 1a–1d have traditionally been implemented using analog electric components such as resistors, capacitors and operational amplifiers. The signal being filtered is an electrical voltage or current corresponding to a physical quantity, such as a sound or video signal. Analog filters, while useful for many purposes, have several associated drawbacks. Since an analog filter is implemented by analog circuitry components, it can be changed only by redesigning or replacing the circuitry components. Moreover, the performance of analog filters, particularly those implemented with analog components, is typically temperature-dependent and subject to drift.

Advances in digital technology have led to the design and implementation of digital filters. Computer programs and/or processors can filter digital signals in the same way that analog filters filter analog signals. A digital filter is typically implemented as software or code running on a processor or controller to perform numerical calculations on sampled values of a signal. The processor may be a general-purpose microprocessor such as a PC microprocessor, or it may be a specialized DSP (Digital Signal Processor) chip. The high computational speeds possible with DSPs make them ideal candidates for implementation of digital filters. Alternatively, a digital filter can be implemented in digital logic hardware. Such hardware configurations can be dedicated or configurable, such as with a PAL or GAL. Digital filters have several advantages over analog filters. As software or code residing in the processor's memory determines the operation of a digital filter, the filter is programmable and can be easily changed or redesigned without changes in the circuitry or hardware. Digital filters are also more stable than analog filters and do not generally suffer from time and temperature induced variations.

A commonly used type of digital filter is a finite impulse response (FIR) filter. Each output of a FIR filter is the sum of a finite number of weighted samples of the input sequence. FIR filters are sometimes also referred to as feed-forward or non-recursive filters since all paths lead forward from the input to the output; no part of the filter output is fed back to the filter input. A common application of digital FIR filters is in video encoders for filtering or scaling input video signals from sources such as computers into forms suitable for display on devices such as television monitors.

A block diagram of a conventional FIR filter 150 is set forth in FIG. 2a. Filter 150, as do most FIR filters, comprises three basic building blocks: unit delays (152, 154, 156); multipliers (162, 164, 166, 168); and adders (172, 174, 176). Input samples $x[n]$ supplied to filter 150 are advanced through unit delays 152, 154 and 156. Typically, each unit delay imposes a delay of one clock cycle. Hence, on a clock cycle where the input sample is $x[n]$, delay 152 outputs the previous input sample $x[n-1]$; delay 154 outputs the second previous input sample $x[n-2]$; and delay 156 outputs the third previous input sample $x[n-3]$. In a hardware or DSP implementation of a unit delay, an input sample value is stored in memory for one clock cycle and then released to the output. In filter 150, for example, delays 152, 154 and 156 may be implemented as three memory cells configured as a shift register.

The input sample $x[n]$ and delayed samples $x[n-1]$ . . . $x[n-3]$ are input to multipliers 162–168 and multiplied by filter coefficients $a[0]$ . . . $a[3]$. A FIR filter is said to comprise a "tap" for each input sample, i.e., $x[n]$ . . . $x[n-3]$, and each filter coefficient is referred to as a "tap coefficient". Even if some the tap coefficients are "0", the filter is still said to comprise the same number of taps as there are input signals. Hence, filter 150 is a 4-tap filter even if some of coefficients $a[0]$ . . . $a[3]$ are "0". The values of filter coefficients $a[0]$-$a[3]$ determine the response and characteristics of filter 150, that is, the coefficient values determine the filter gain and frequency response. In a video encoder implementation, the coefficient values will determine the scaling and filtering performed on input data samples. From a mathematical standpoint, computation of the filter coefficients is often the most difficult and complex part of filter design. Several approaches for coefficient generation are familiar to those of ordinary skill in the art. Examples include the Fourier Series method, the Frequency Sampling method and the Remez Exchange Method.

The multiplied or weighted outputs of multipliers 162 . . . 168 are summed by adders 172 . . . 176. The output $y[n]$ of filter 150, then, can be expressed as:

$$y[n]=a[0]x[n]+a[1]x[n-1]+a[2]x[n-2]+a[3]x[n-3].$$

More generally speaking, the output y[n] of an M+1 tap filter can be expressed as:

$$y[n] = \sum_{k=0}^{M} a_k x[n-k].$$

Hence, each output sample can be described as the current weighted input sample added to a predetermined number of previous and variously weighted input samples.

FIG. 2b illustrates a filter 180 that is an alternative implementation of filter 150 of FIG. 2a. Filter 180 is a 4-tap filter and generates an output y[n] that is the same as the output y[n] of filter 150. Line stores 182 ... 186 perform the same function as delay elements 152 ... 156, except they store adjacent sequences of samples, or lines, as opposed to consecutive samples. Therefore, line stores 182–186 store an input sample and generate an output sample on each clock cycle, and the outputs of line stores 182-186 are delayed one line relative to their inputs. Multiplier 188 multiplies an input sample by a coefficient a[0], multiplier 190 multiplies the corresponding sample from the previous line (i.e., the output sample of line store 182) by a coefficient a[1], multiplier 192 multiplies the corresponding sample from the second previous line by a coefficient a[2], and multiplier 194 multiplies the corresponding sample from the third previous line by a coefficient a[3]. Adder 196 performs the function of adders 172 ... 176 of filter 150 and generates an output $$y[n] = \sum_{k=0}^{M} a_k x[n-k].$$

In video signal filtering and scaling applications, filters such as filters 150 and 180 are often inadequate for smoothing out significant variations that may occur from input line to input line. This is especially important for video applications where the display is interlaced. As illustrated in FIG. 2c, a second filter 198 may be employed to address this problem. The output y[n] of filter 180 is supplied to line store (delay element) 191 of filter 198 and to multiplier 193. Multiplier 193 multiplies the current filter output y[n] by a first smoothing coefficient i[0], and multiplier 195 multiplies the previous filter output y[n−1] output by line store 191 by a second smoothing coefficient i[1]. The smoothing coefficients are chosen or calculated to attenuate any large variations between adjacent output lines. The outputs of multipliers 193 and 195 are summed by adder 197 to generate a smoothed output z[n].

Among the basic components of a FIR filter, the multiplier is the most complex and costliest to implement. Moreover, the operational speed of conventional implementations of multipliers is relatively slow and imposes a fundamental limit on the speed and throughput of the filter. Conventional FIR filters such as filters 150 and 180 suffer from the drawback of using a large number of multipliers. Additionally, conventional FIR filters are often inadequate for smoothing large variations between proximate input samples. Where an additional filter such as filter 198 of FIG. 2c is used to address this problem, the number of multipliers is further increased as is the number of line stores required.

SUMMARY OF THE INVENTION

The present invention provides a partial sum digital FIR filter that uses a reduced number of multipliers and provides enhanced smoothing of large variations between proximate input data samples. The FIR filter produces partial sums of previous input samples that are provided to an adaptive filter controller. The adaptive filter controller uses the partial sums and the current input sample to detect and smooth large variations between adjacent samples.

In one embodiment of the invention, a digital FIR filter is provided that inputs a series of data samples x[0] ... x[n] and generates a partial sum output PS[i], where i≦n. The partial sum output comprises a weighted version of the a difference between a partial sum of the previous i−1 data samples, PS[i−1], and the current data sample x[n] added to the current data sample x[n]. The filter includes a plurality of weighting stages. Each weighting stage includes a first adder for subtracting the current data sample x[n] from the previous partial sum PS[i−1], a multiplier that multiplies the difference by a weighting coefficient, and a second adder that sums the weighted difference with the current data sample. The filter also includes a plurality of delay elements, each of which inputs a partial sum and imposes a unit delay on the partial sum before supplying it to a weighting stage.

Further features and advantages of this invention as well as the structure of operation of various embodiments are described in detail below with reference to the accompanying drawings.

BRIEF DESCRIPTION OF THE DRAWINGS

The present invention is described with reference to the accompanying drawings. In the drawings, like reference numbers indicate identical or functionally similar elements.

FIG. 2b is a block diagram of an alternative implementation of the FIR filter of FIG. 2a;

DETAILED DESCRIPTION OF PREFERRED EMBODIMENTS

1. A Partial Sum Digital FIR Filter

Figure 3:
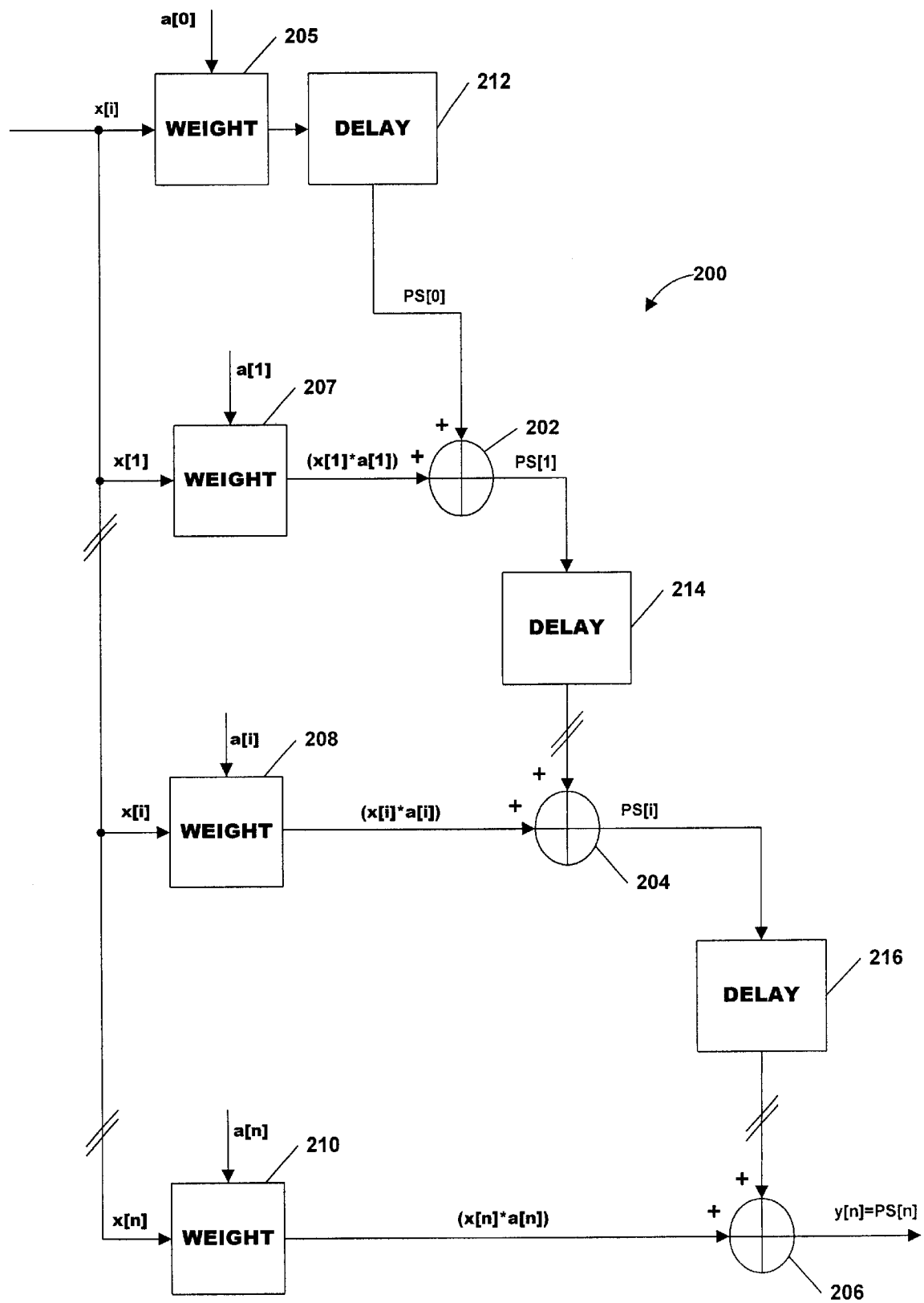
FIG. 3 is a general block diagram of a partial sum digital FIR filter.

A generic partial sum digital FIR filter 200 is depicted in FIG. 3. For a series of input data samples x[i], where i=0 to n, filter 200 comprises n adders, n delay elements and n+1 weighting elements. Stated another way, for N input data samples (N=n+1), filter 200 comprises N−1 adders, N delay elements, and N weighting elements. For sake of illustration, filter 200 is depicted in FIG. 3 as comprising three adders 202, 204, 206; three delay elements 212, 214, 216; and four weighting elements 205, 207, 208, 210. It should be understood, however, that filter 200 could comprise any number n adders, delay elements, and weighting elements. Generally speaking, the output of each adder is the sum of the weighted current data sample x[i] and the partial sum of the previous i−1 data samples.

Each delay element imposes a unit delay, or a delay of one clock cycle, on the data input to the delay element. Other periods of delay could be utilized, but a delay of one clock cycle is most typical and will be assumed in the description below. Consider, for example, a clock cycle where the current input sample is x[i]. On this clock cycle, delay 212 would output the previous weighted input sample x[i−1] to adder 202. In a hardware or DSP implementation of a unit delay, an input sample value is stored in memory for one clock cycle and then released to the output. In filter 200, for example, delays 212, 214 and 216 may be implemented as three memory cells configured as a shift register.

Weighting elements 205, 207, 208, and 210 are typically implemented as multipliers or gain stages and the filter coefficients can also be referred to as gain coefficients. With reference to filter 200 of FIG. 3, it will be assumed that the weighting stage involves only a multiplication or gain operation. As noted above, for a series of data samples x[i], where i=0 to n, filter 200 would include N weighting or multiplication stages, where N=(n+1), and hence, would utilize gain coefficients a[0] . . . a[n]. The values of the gain coefficients determine the response and characteristics of filter 200, that is, the coefficient values determine the filter gain and frequency response.

Filter 200 generates an output y[n]=x[n]*a[n]+PS[n−1]. In addition to the ultimate output y[n], upon the receipt of each new data sample, filter 200 generates a plurality of partial sums of previous data samples. Generally speaking, where i≦n, the i-th partial sum can be expressed as PS[i]=x[n]*a[i]+PS[i−1]. The partial sums generated by filter 200 are useful for purposes that will be described in detail below.

The operation of filter 200 is best explained by way of example. Consider a series of data samples x[0] . . . x[n], assuming (as illustrated) that n=3. On the first clock cycle, the first data sample x[0] is input to weighting element 205 and multiplied by a[0]. The output of weighting element 205 is then stored in delay element 212 as partial sum PS[0]. Partial sum PS[0] is stored by delay element 212 for one clock cycle. On the second clock cycle, data sample x[1] is multiplied by a tap coefficient a[1] at weighting stage 207 and is then presented to adder 202 along with partial sum PS[0]. Adder 202 sums the two to form the partial sum PS[1]=x[1]*a[1]+PS[0].

Partial sum PS[1] is stored by delay element 214 for one clock cycle. On the third clock cycle, data sample x[2] is multiplied at block 208 by tap coefficient a[2] and is presented to adder 204 along with PS[1] to form the next partial sum PS[2]=x[2]*a[2]+PS[1]. Partial sum PS[2] is then stored for one clock cycle by delay element 216. On the fourth clock cycle, data sample x[3] is weighted (multiplied by a coefficient a[3]) at block 210 and is then input to adder 206 along with PS[2] to form the final partial sum and filter output y[3]=PS[3]=x[3]*a[3]+PS[2].

For data samples x[0] . . . x[n], then, the output y[n] of filter 200 is the sum of the weighted current data sample x[n] and the partial sum of the previous n−1 data samples, or y[n]=x[n]*a[n]+PS[n−1]. Additionally, each summer generates a partial sum output PS[i]=x[i]*a[i]+PS[i−1], where i≦n. Relative to a conventional FIR filter, such as FIR filter 150 depicted in FIG. 2a, filter 200, as implemented, does not present any benefit in terms of the number of elements or components; however, filter 200 provides the added benefit of generating a series of partial sums that can be used for additional purposes. The partial weighted sums output by each adder stage provide useful functionality. In order to detect significant variations in the input data samples, for example, the partial sums of previous data samples may be compared to the current input sample. As will be described below, detection of significant variations in the input sample permits application of an adaptive filtering algorithm that dynamically changes the weighting or tap coefficients in order to smooth out the variations in the input sample values.

Figure 4:
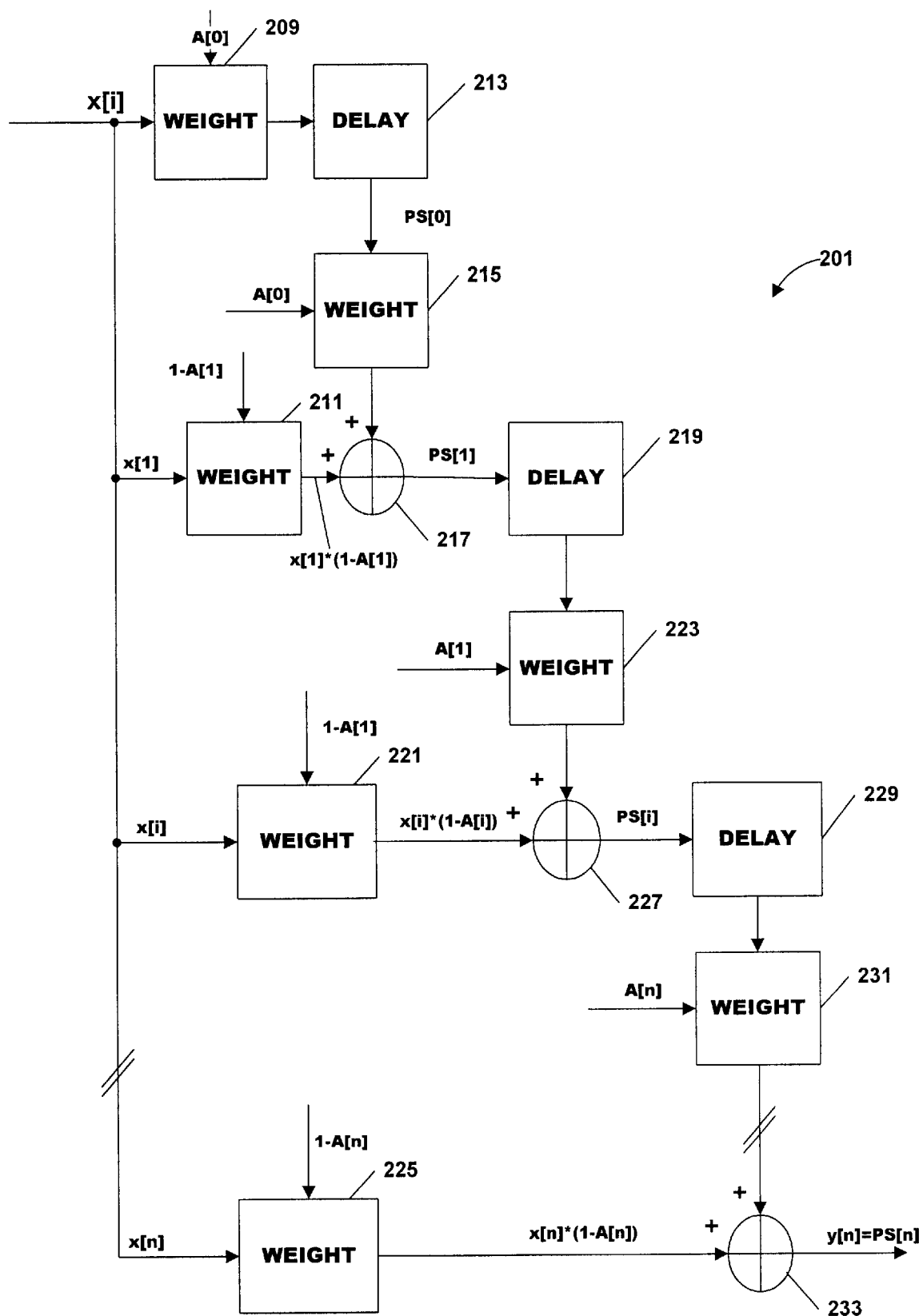
FIG. 4 is a block diagram of one implementation of a partial sum digital FIR filter with normalized partial sums.

One method for taking advantage of the partial sum configuration is to use normalized filter coefficients. Filter 201 illustrated in FIG. 4 is presented solely for the purpose of illustrating how normalizing the filter coefficients can lead to a beneficial reduction in the number of filter elements, particularly in the number of multipliers. Filter 201 appears to be very similar to filter 200 in FIG. 3; however, weighting stages 209, 211, 221, and 225 do not multiply the data samples by filter coefficients a[0] . . . a[n]. Rather, filter 201 uses normalized coefficients A[1] . . . A[n] and (1−A[0]) . . . (1−A[n]). A normalized filter coefficient A′[i] is obtained by dividing the filter gain at the i-th stage by the total filter gain up to the i-th stage. This is expressed as:

$$A'[i] = \frac{a_i}{\sum_{i=0}^{i} a_i}.$$

Thus, for example, A′[0]=1, because $$\frac{a_0}{\sum_{i=0}^{0} a_i} = 1.$$

In FIG. 4, A[i]=1−A′[i], as defined above, and 1−A[i]=A′[i]. Using the coefficients as shown in FIG. 4, the partial sum for the i-th stage is given by:

$$PS[i]=(x[i]*(1-A[i]))+(PS[i-1]*A[i]).$$

Multiplying through gives, $$PS[i]=(x[i]-x[i]*A[i]+A[]*PS[i-1],$$

which can be rewritten as:

$$PS[i]=x[i]-A[i]*(x[i]-PS[i-1]).$$

Rearranging terms provides:

$$PS[1]=x[i]+A[i]*(PS[i-1]-x[i]) \qquad \text{(equation 1)},$$

or for the final product output of filter 201:

$y[n]=x[n]+A[n]*(PS[n-1]-x[n])$.

Filter 201 obviously increases the number of gain stage, and therefore, the number of multipliers and thus, would not be used. But using equation 1 provides a filter design that actually reduces the number of multipliers. Such an implementation is illustrated by filter 220 in FIG. 5. Generally speaking, for filter 220, where i≦n, the i-th partial sum can be expressed as PS[i]=x[i]+A[i](PS[i-1]-x[i]), which is equation 1.

Figure 5:
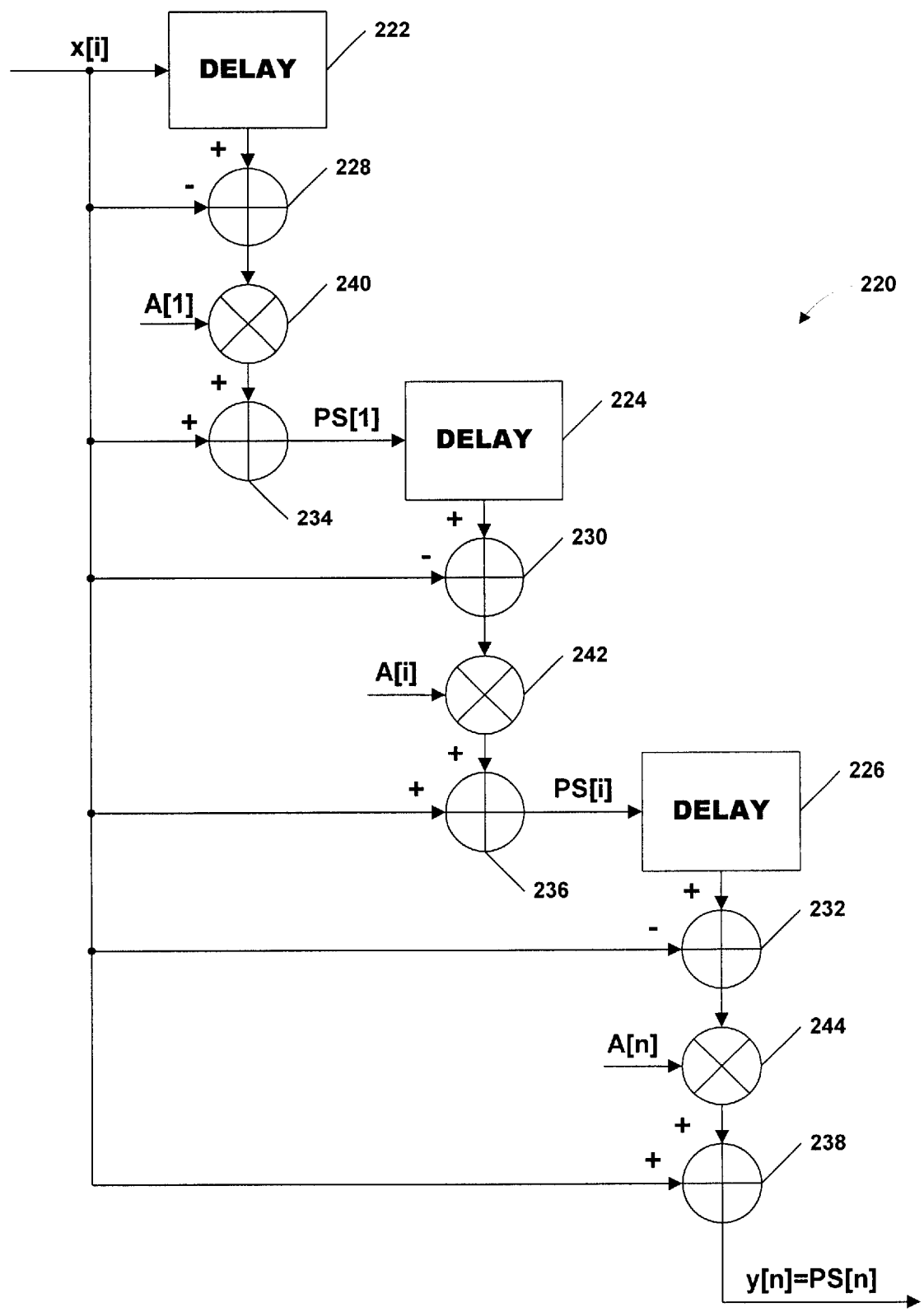
FIG. 5 is a block diagram of a digital FIR filter with normalized partial sums according to the present invention.

For a series of data samples x[0] . . . x[n], filter 220 comprises 2n adders, n delay elements and n multipliers. Stated another way, for N (N=n+1) data samples, filter 220 comprises 2(N-1) adders, N-1 delay elements and N-1 multipliers. For sake of illustration, filter 220 is depicted in FIG. 5 as comprising six adders 228, 230, 232, 234, 236 and 238; three delay elements 222, 224, 226; and three multipliers 240, 242 and 244. It should be understood, however, that filter 220 could comprise any number n delay elements and multipliers and 2n adders. Generally speaking, the output of each adder is the normalized weighted sum of the current data sample x[n] and the partial sum of the previous i-1 data samples.

Again, the operation of filter 220 is best explained by way of example. Consider a series of data samples x[0] . . . x[n] and assume that n=3. On the first clock cycle, the first data sample x[0] is admitted to delay element 222 and stored there for one clock cycle. On the second clock cycle, the first data sample x[0] is input to adder 228 along with the next data sample x[1]. Adder 228 subtracts the current data sample from the delayed data sample and outputs the result x[0]-x[1] to multiplier 240. Multiplier 240 multiplies the output of adder 228 by a tap or gain coefficient A[1] and outputs the result, A[1](x[0]-x[1]), to adder 234. Remember, gain coefficient 1-A[0]=1; therefore, we do not need a weighting stage for 1-A[0], and x[0]=PS[0]. Adder 234 adds the current data sample x[1] to this result to form the first partial sum PS[1]=x[1]+A[1](x[0]-x[1]), which is input to delay element 224.

On the next clock cycle, adder 230 subtracts the next data sample x[2] from the first partial sum PS[1] of the previous data samples that is output by delay element 224. The output of adder 230 is weighted by a coefficient A[2] at multiplier 242 to generate an output A[2](PS[1]-x[2]) to adder 236. The current data sample is added to form the second partial sum PS[2]=x[2]+A[2](PS[1]-x[2]), which is input to delay element 226. Generally speaking, for a filter that receives data samples x[0] . . . x[n], each summer configured as summers 234 . . . 238 will generate a partial sum output PS[i]=x[i]+A[i](PS[i-1]-x[k]), where i≦n.

On the next clock cycle, adder 232 subtracts the next data sample x[3] from the second partial sum PS[2] of the previous data samples. This result is weighted by a coefficient A[3] at multiplier 244 to generate an output A[3](PS[2]-x[3]) to adder 238. The current data sample x[3] is added to this to form the filter output and third partial sum y[3]=PS[3]=x[3]+A[3](PS[2]-x[3]). Hence, the filter output can be expressed more generally as y[n]=x[n]+a[n](PS[n-1]-x[n]).

Figure 1A:
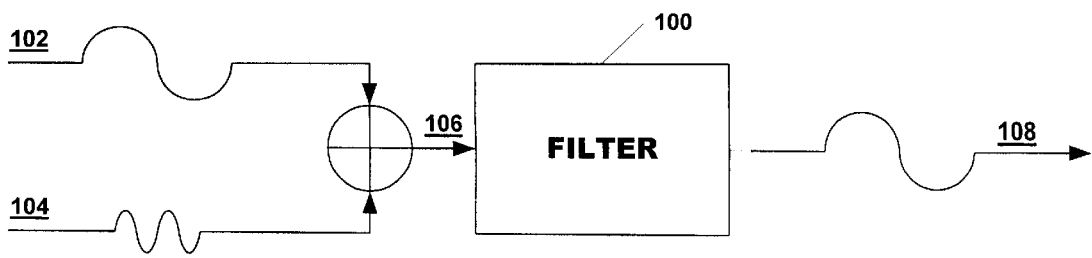
FIG. 1a is a general block diagram of an analog filter.
Figure 1B:
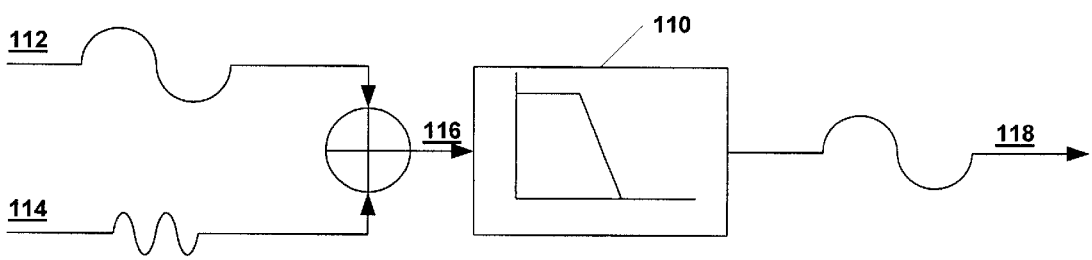
FIG. 1b is a general block diagram of an analog low pass filter.
Figure 1C:
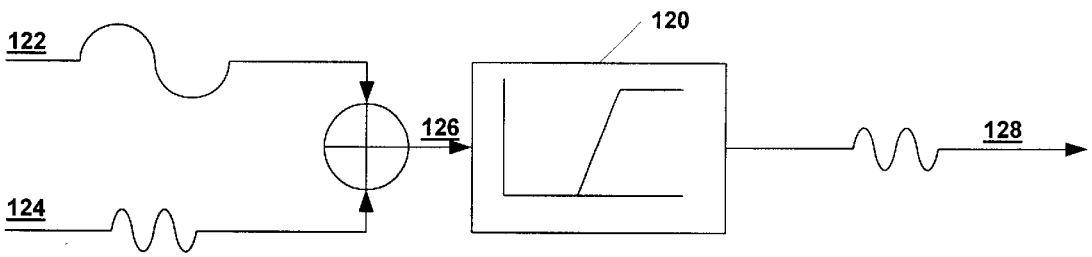
FIG. 1c is a general block diagram of an analog high pass filter.
Figure 1D:
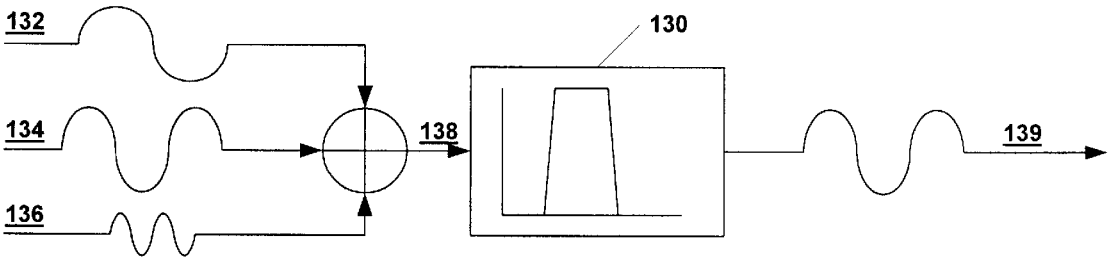
FIG. 1d is a general block diagram of an analog bandpass filter.
Figure 2A:
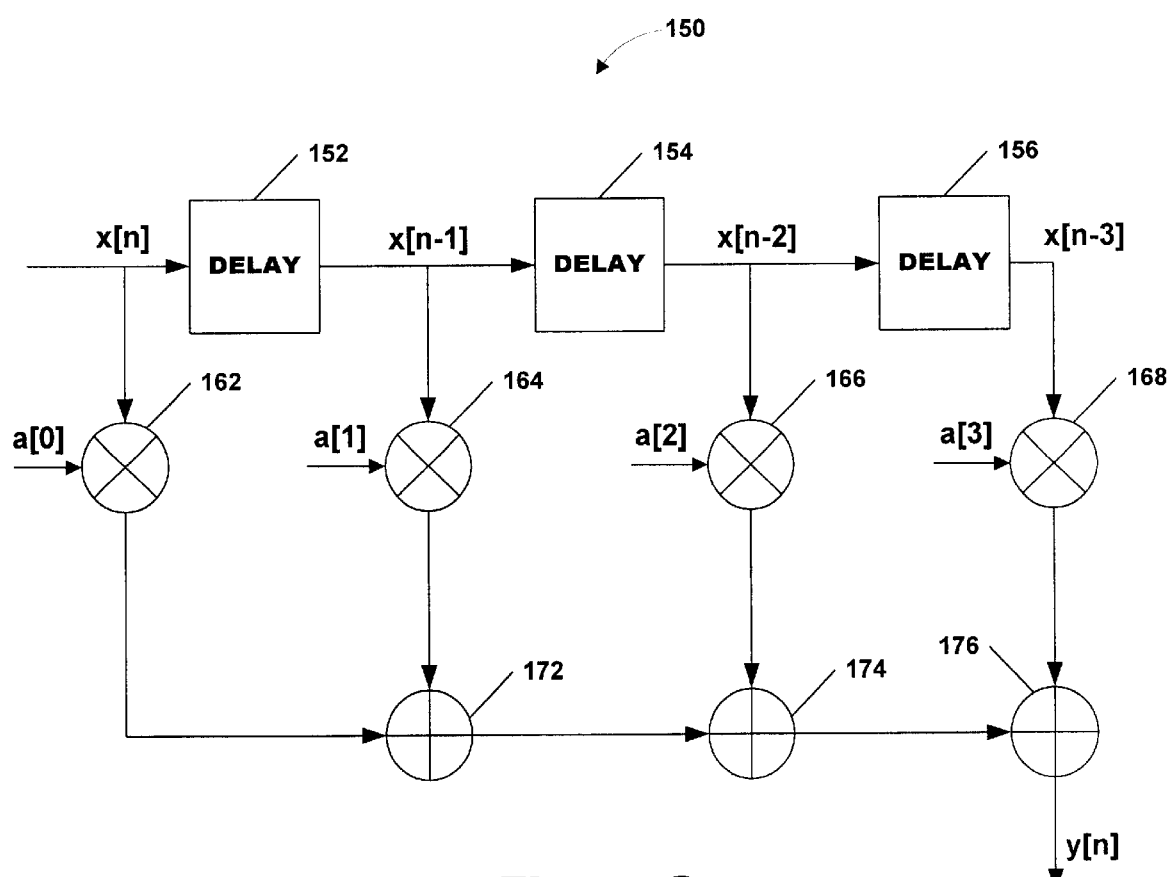
FIG. 2a is a block diagram of a conventional digital FIR filter.

Relative to the conventional FIR filter 150 of FIG. 2a, filter 220 has the same number of stages but requires one less multiplier. That is, where N=n+1 (a series of data samples x[0] . . . x[n]), filter 150 requires N multipliers whereas the filter 220 requires only N-1 multipliers. Although N-1 additional adders are required, adders are less costly and complex to implement, so a net cost and complexity savings is still obtained. Moreover, as described with reference to filter 200 of FIG. 3, the use of partial sums PS[1], PS[i] . . . PS[n] is advantageous as it provides the ability to compare the values of incoming data samples to that of previous data samples. The use of partial sums in the context of a video encoder to adaptively react to significant variations between input data samples will be explained below with reference to FIGS. 8 and 9. As will also be explained below with reference to FIGS. 8 and 9, the design of filter 220 can also be implemented using line stores and multiplexers.

It is sometimes advantageous to normalize the partial sums to full scale so that a meaningful comparison with incoming data samples can be made. In filter 200 of FIG. 3, for example, since the partial sums PS[0] . . . PS[i] have not passed through all gain or multiplier stages, they will not be at full scale. In order to normalize these partial sums, a normalization factor consisting of the full gain (i.e., the sum of all the coefficients a[0] . . . . a[n]) divided by the partial gain (i.e., the sum of the coefficients up to that point) up to a particular point can be used.

Figure 6:
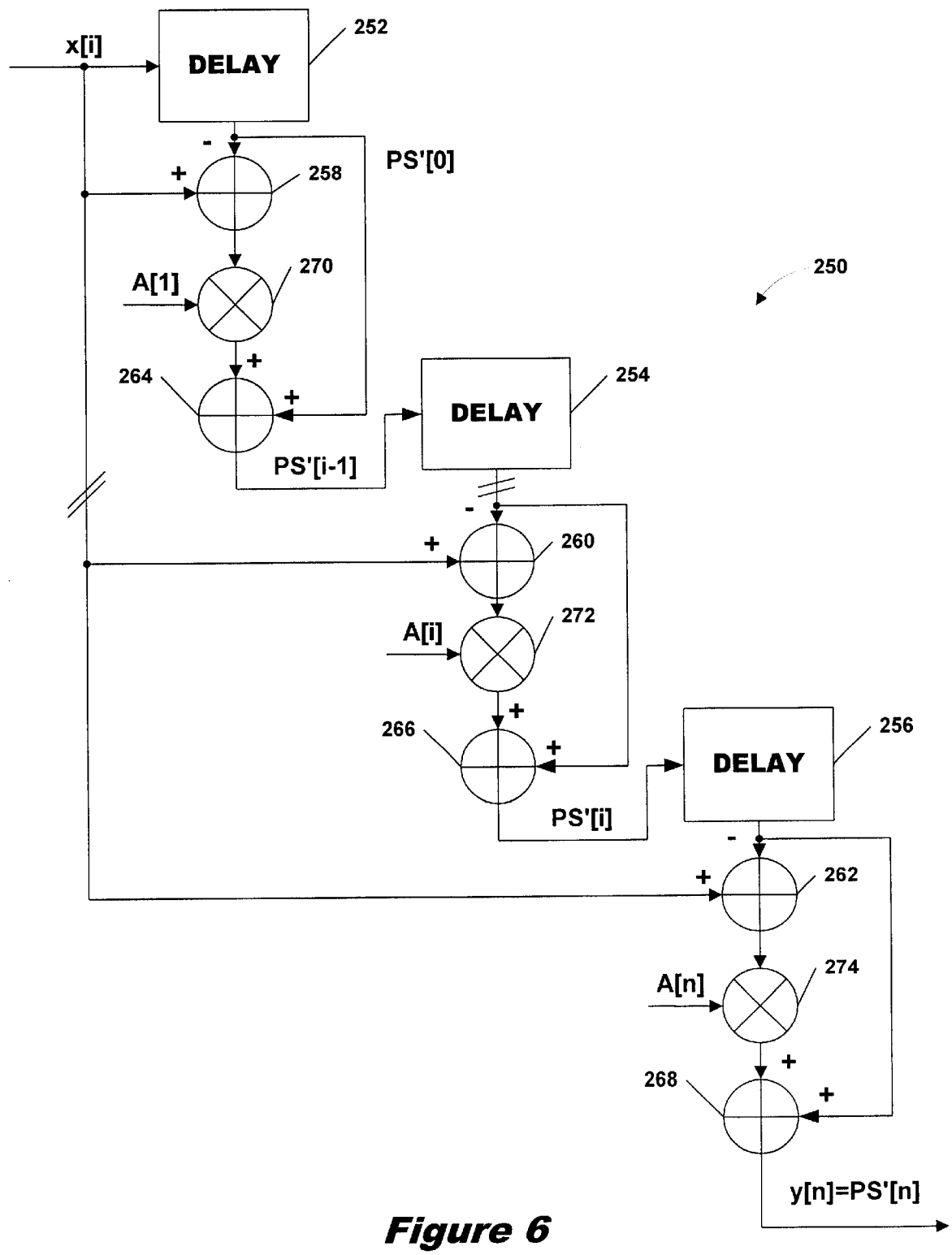
FIG. 6 is a block diagram of a digital FIR filter with normalized partial sums according to the present invention.

Filter 220 illustrates one implementation of a filter that uses normalized filter coefficients. Filter 250 in FIG. 6 illustrates an alternative filter implementation with normalized filter coefficients. Before describing the physical implementation of filter 250, the equations describing the filter will be derived. The following equations assume an overall or DC gain of unity (one).

First, a typical partial sum is considered:

$$PS[i] = \sum_{n=0}^{i} a[i] \cdot x[i]. \qquad \text{(equation 2)}$$

The partial sum PS[i] is then normalized by multiplying it by the total filter gain (from n=0 to n=N) divided by the filter gain up to the partial sum i being considered (from n=0 to n=i). The normalized partial sum PS'[i] can be expressed as:

$$PS'[i] = PS[i] \cdot \frac{\sum_{n=0}^{N} a[n]}{\sum_{n=0}^{i} a[n]}. \qquad \text{(equation 3)}$$

For a DC gain of unity $$\left( \sum_{n=0}^{N} a[n] = 1 \right),$$

the normalized partial sum is:

$$PS'[i] = PS[i] \cdot \frac{1}{\sum_{n=0}^{i} a[n]}. \qquad \text{(equation 4)}$$

The partial sum up to a point i (PS[i]) is equal to the partial sum up to a point i-1 (PS[i-1]) added to the i-th gain factor or coefficient (a[i]) multiplied by the i-th data sample (x[i]), or PS[i]=PS[i-1]+a[i]x[i]. Substituting this relationship into equation 3 yields:

$$PS'[i] = (PS[i-1] + a[i]x[i]) \cdot \frac{\sum_{n=0}^{N} a[n]}{\sum_{n=0}^{i} a[n]}. \quad \text{(equation 5)}$$

Normalizing PS[i−1] yields $$PS'[i-1] = PS[i-1] \cdot \frac{\sum_{n=0}^{N} a[n]}{\sum_{n=0}^{i-1} a[n]},$$

or (solving for PS[i−1]):

$$PS[i-1] = PS'[i-1] \cdot \frac{\sum_{n=0}^{i-1} a[n]}{\sum_{n=0}^{N} a[n]}.$$

Substituting this relationship into equation 5 yields:

$$PS'[i] = \left(PS'[i-1] \cdot \frac{\sum_{n=0}^{i-1} a[n]}{\sum_{n=0}^{N} a[n]} + a[i]x[i]\right) \cdot \frac{\sum_{n=0}^{N} a[n]}{\sum_{n=0}^{i} a[n]}. \quad \text{(equation 6)}$$

Equation 6 can also be expressed as (by multiplying through):

$$PS'[i] = PS'[i-1] \cdot \frac{\sum_{n=0}^{i-1} a[n]}{\sum_{n=0}^{i} a[n]} + a[i]x[i] \cdot \frac{\sum_{n=0}^{N} a[n]}{\sum_{n=0}^{i} a[n]}. \quad \text{(equation 7)}$$

By defining $$A[i] = \frac{a[i]}{\sum_{n=0}^{i} a[n]},$$

equation 7 becomes:

$$PS'[i] = PS'[i-1](1 - A[i]) + A[i]x[i]\sum_{n=0}^{N} a[n]. \quad \text{(equation 8)}$$

By multiplying through and regrouping, equation 8 can be expressed as:

$$PS'[i] = PS'[i-1] + A[i]\left(x[i]\sum_{n=0}^{N} a[n] - PS'[i-1]\right). \quad \text{(equation 9)}$$

For a total gain of unity $$\left(\sum_{n=0}^{N} a[n] = 1\right)$$

equation 9 becomes:

$$PS'[i]=PS'[i-1]+A[i](x[i]-PS'[i-1]) \quad \text{(equation 10)}.$$

Filter 250 of FIG. 6 implements normalized partial sums in accordance with equation 10. Note that equation 10 can also be derived by substituting A'[i]=1−A[i] into equation 1. Thus, A[i]=1−A'[i], and substituting in equation 1 gives:

$$PS[i]=x[i]+(1-A'[i])*(PS[i-1]-x[i]).$$

Multiplying through gives:

$$PS[i]=x[i]+PS[i-1]-(A'[i]*PS[i-1])-x[i]+(A'[i]*x[i]),$$

which reduces to:

$$PS[i]=PS[i-1]-A'[i]*(PS[i-1]+x[i]).$$

Rearranging terms produces:

$$PS[i]=PS[i-1]+A'[i]*(x[i]-PS[i-1]),$$

which is of the same form as equation 10.

For a series of data samples x[0] . . . x[n], filter 250 comprises 2n adders, n delay elements and n multipliers. Stated another way, for N (N=n+1) data samples, filter 250 comprises 2(N−1) adders, N−1 delay elements and N−1 multipliers. Three stages are illustrated, but any number of stages may be utilized to provide the number of partial sums desired. Like filter 220, each stage of filter 250 includes a delay element (252, 254, 256); a first adder (258, 260, 262); a multiplier (270, 272, 274); and a second adder (264, 266, 268). The main differences between filter 250 and filter 220 are as follows. At the first adder in each stage, rather than subtracting the current data sample from the partial sum, the partial sum is subtracted from the current data sample. At the second adder in each stage, rather than adding the current data sample to the weighted partial sum, the partial sum from the previous stage is added to the weighted partial sum.

Again, the operation of filter 250 is best explained by way of example. Consider a group of incoming data samples x[0] . . . x[n], and assume that n=3. The first data sample x[0] is stored by delay element 252 for one clock cycle and input to adder 258 along with the next data sample x[1] at the next clock cycle. Adder 258 subtracts the delayed data sample from the current data sample and outputs the result x[1]−x[0] to multiplier 270. Multiplier 270 multiplies the output of adder 258 by a gain or weighting coefficient A[1] and outputs the result, A[1](x[1]−x[0]), to adder 264. The coefficient A[1] is calculated as described above. The previous data sample x[0] is added to form the first normalized partial sum PS'[1]=x[0]+A[1](x[1]−x[0]) which is input to delay element 254.

On the next clock cycle, adder 260 subtracts the first partial sum PS'[1] from the next data sample x[2], and outputs the result x[2]−PS'[1] to multiplier 272. Multiplier 272 performs a weighting operation and outputs A[2](x[2]−PS'[1]) to adder 266. The first normalized partial sum is added to form the second normalized partial sum PS'[2]= PS'[1]+A[2](x[2]−PS'[1]), which is input to delay element 256. The third partial sum is formed in a similar manner. On the next clock cycle, adder 262 subtracts the second partial sum from the next data sample, multiplier 264 multiplies the result by the coefficient A[3], and the second normalized partial sum is added to form the third normalized partial sum PS'[3]=PS'[2]+A[3](x[3]−PS'[2]). Hence, it can be seen that filter 250 impliments the relationship PS'[i]=PS'[i−1]+A[i](x[i]−PS'[i−1]).

Figure 7:
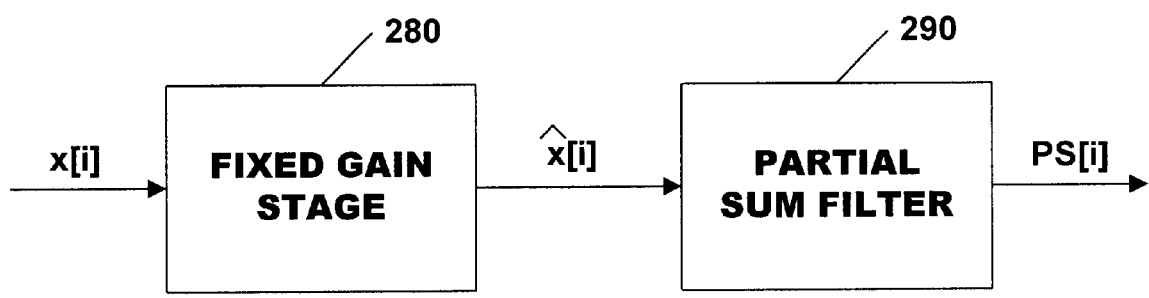
FIG. 7 is a block diagram of a partial sum filter according to the present invention in combination with a fixed gain stage.

Filter 250 assumes a DC gain of unity. If the DC gain is not unity, a fixed DC gain can be applied to the input data samples with a fixed DC gain or multiplier stage (e.g. shifts and adds) prior to processing the data samples with the partial sum filter. Such a configuration is depicted in FIG. 7, including a fixed gain or multiplier stage 280 and a partial sum FIR filter stage 290. Filter 290 is configured as one of the previously described filters 250 or 220, and fixed gain stage 280 provides the required DC gain where it is not unity. Gain stage 280 applies the desired DC gain to input samples x[i] and outputs the samples x̂[i] with gain applied to filter 290. Therefore, filter 290 implements:

$$y[n]=PS[n]=PS[n-1]+A[n]*(\hat{x}[n]-PS[n-1]).$$

2. An Adaptive Encoder Implementing the Partial Sum FIR Filter

Digital image data, such as the graphics data from a computer, often needs to be filtered and/or scaled for display on a television-type display monitor or device. The partial sum FIR filter described above is well suited for such applications. The need for filtering and scaling arises from the differences in display resolution between computer and television monitors. Resolution is the basic measurement of how much information is on the screen. Resolution is described by a first number representing horizontal resolution (total number of pixels in one horizontal scan line) and a second number representing vertical resolution (total number of horizontal lines down the screen). The typical resolution of a computer monitor is, at a minimum, 800×600, and may be upwards of 1280×1024. The standard television display resolution (for an NTSC signal), by contrast, is only 640×480. Hence, vertical scaling is the process of making the 600 lines (or more) displayed by a computer fit within the television vertical line resolution; and horizontal scaling is the process of making the 800 pixels (or more) per horizontal line displayed by a computer fit within the television horizontal resolution. Scaling algorithms and techniques are typically implemented in and carried out by a video encoder.

In addition to resolving resolution differences, horizontal and vertical scaling is necessary to counter overscan in the television display. The electron gun in a television set typically overscans the edges of the viewable display area by five to fifteen percent, causing the image to bleed off of the edges in all directions. Overscan is not typically a significant problem when broadcast or recorded signals are displayed on the television, since the viewer usually has no knowledge of the source material. It can, however, pose serious problems when computer-generated video data is displayed on a television. Critical information, such as menus or tool bars, may be lost outside of the television viewable area.

In determining the amount of vertical filtering or scaling that is necessary, flicker must also be taken into account. In a computer-generated image, there are frequently abrupt transitions from one scan line to the next. Even at the NTSC scan rate of 60 Hz, the human eye can detect these transitions and scan lines may be seen flashing individually every ¹⁄₃₀ of a second. Vertical or flicker filtering is a technique employed to remove flicker from computer-generated video displayed on a television. A vertical filter averages adjacent scan lines to soften the transition between dark and light lines and to produce lines with less sharply defined contrasts. One common filter, for example, produces a television line by adding one quarter of the current line, two quarters of the previous line and one quarter of the line before that. This is called a "1-2-1" or a "¼-½-¼" filter.

Figure 8:
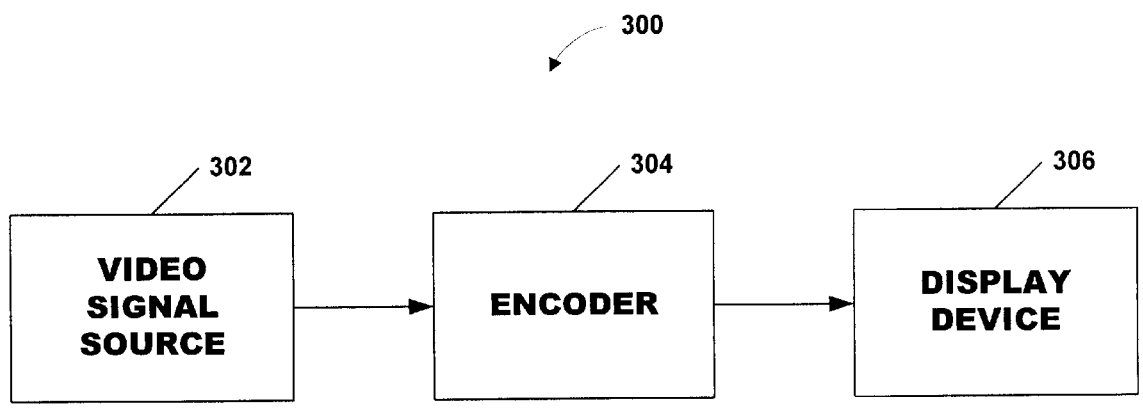
FIG. 8 is a general block diagram of a video signal encoding system.

FIG. 8 depicts generally a video signal encoding system 300 comprising a video signal source 302, an encoder 304 and a video signal display device 306. Video signal source 302 supplied digitized information samples to encoder 304. In one implementation, signal source 302 is a computer. If the samples supplied by source 302 are not digitized, encoder 304 may include an analog-to-digital converter to digitize the samples. Encoder 304 performs filtering and/or scaling on the digitized samples provided by source 302 and outputs a filtered/scaled sample stream suitable for display on display device 306. In one implementation, encoder 304 includes a partial sum digital filter according to the present invention, such as filter 250 or filter 220. Display device 306 displays the filtered/scaled data output by encoder 304. In one implementation, display device 306 is a television monitor.

Figure 2B:
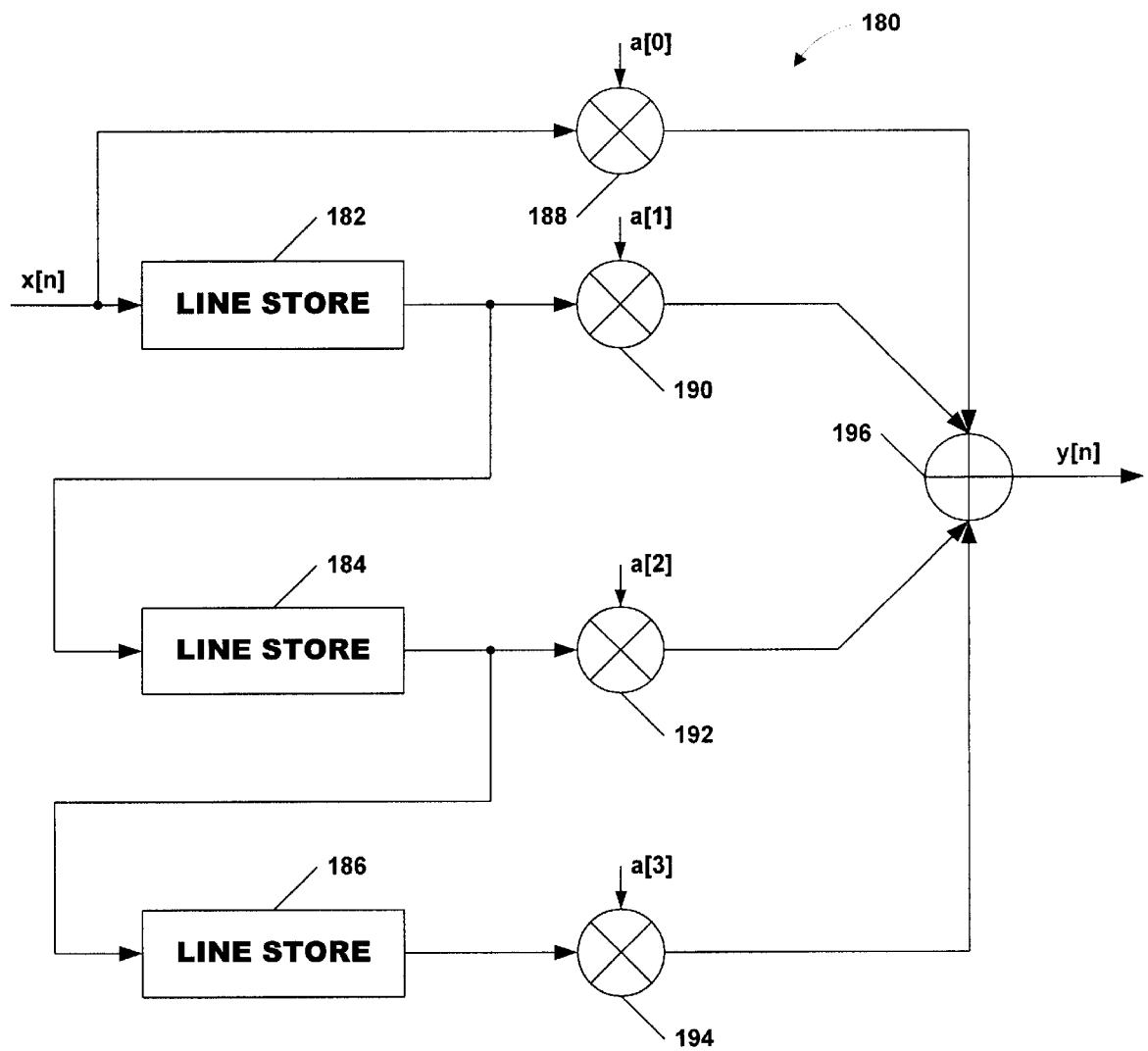
Figure 2C:
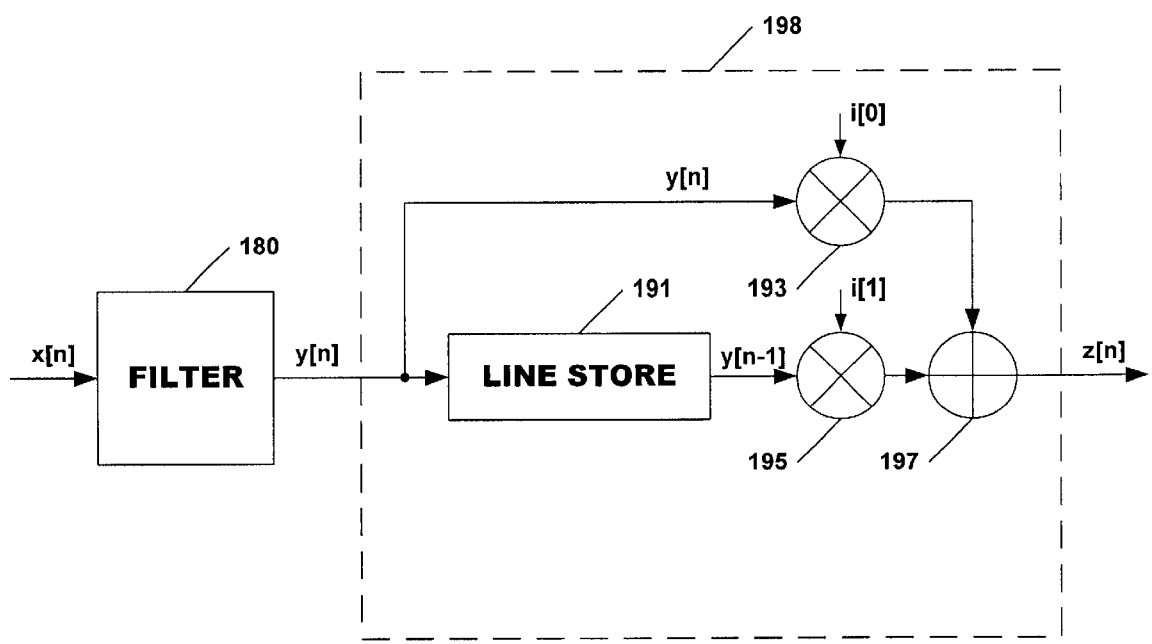
FIG. 2c is a block diagram illustrating the filter of FIG. 2b in combination with a second filter for attenuating significant variations between input data samples.
Figure 9:
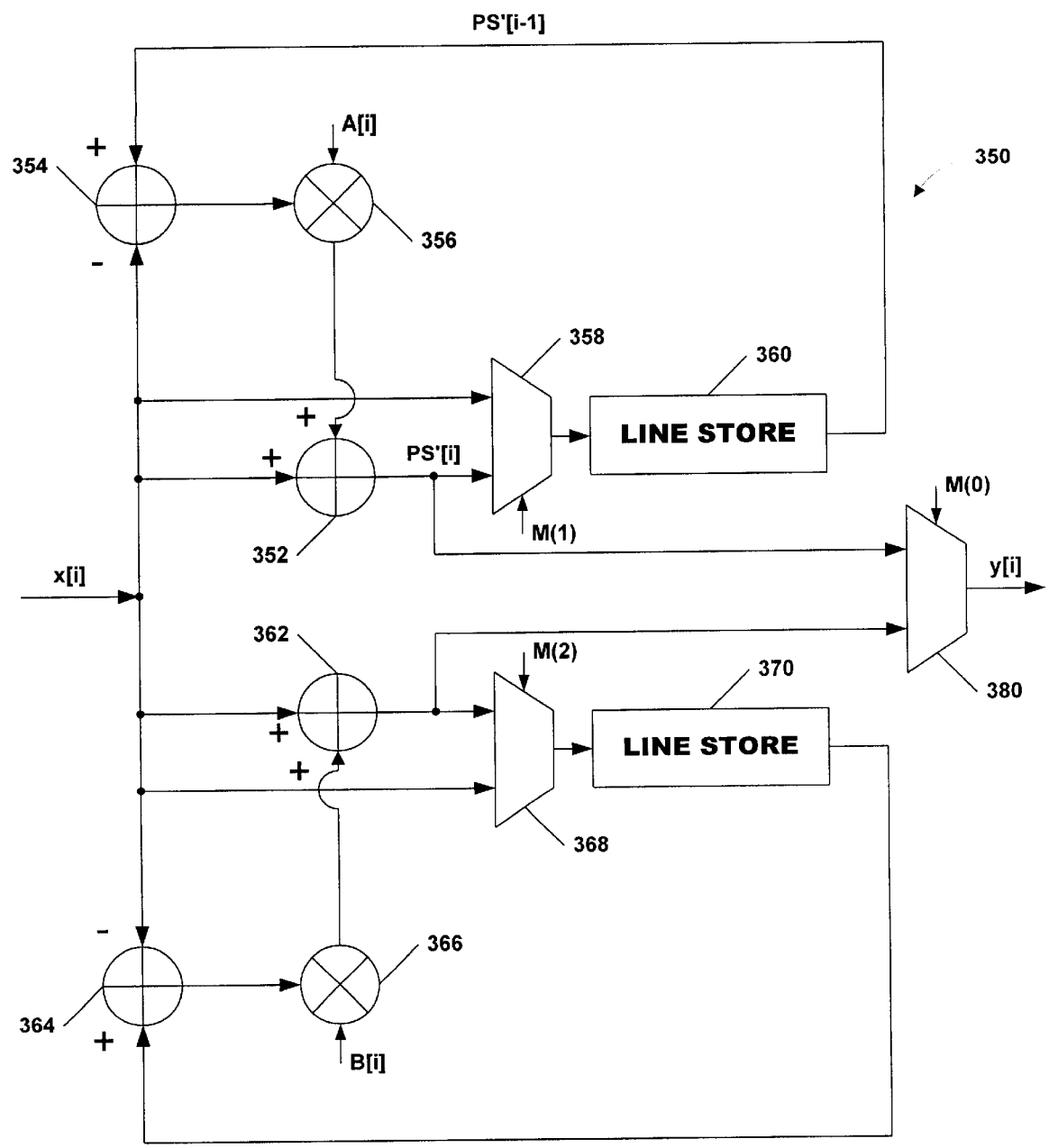
FIG. 9 is a block diagram of another implementation of a digital FIR filter with normalized partial sums according to the present invention.

FIG. 9 depicts a digital FIR filter 350 that generates normalized partial sums. Filter 350 is an alternate implementation of filter 220 described with reference to FIG. 5. Multiplexers are used to further reduce the number of line stores required, with reference to, for example, filter 180 in FIG. 2b. Filter 350 is preferably implemented in a video encoder such as encoder 304 of FIG. 8.

Considering the top half of filter 350 (of which the bottom half is a mirror image), input samples x[0] . . . x[i] are provided to adders 352 and 354. If filter 350 does not provide a unity gain, the input samples may be first processed by a fixed gain stage (see FIG. 7). Via multiplexer 358, an input sample x[i] is input to and stored in line store 360. The setting of bit M(1) determines the operation of multiplexer 358. Based on the setting of M(1), multiplexer 358 may admit either the current sample x[i] or the current normalized partial sum PS'[i] to line store 360. As will be explained below, this information is stored in line store 360 and provided to an adaptive filter controller in order to minimize the effects of large variations between input samples.

Initially, adder 354 subtracts the next input sample x[i] from the corresponding sample of the previous input line, sample x[i−1] output by line store 360. The output of adder 354 is multiplied by a coefficient A[i], calculated as described above, and the result A[i](x[i−1]−x[i]) is added to the current sample x[i], to generate a partial sum output PS'[i]=x[i]+A[i](x[i−1]−x[i]) to multiplexer 380. This partial sum is also provided to line store 360 to be recycled through filter 350.

To understand the operation of this configuration, consider an example that performs five tap filtering. The first input line is stored directly into line store 360 through multiplexer 358. As the second, third, and fourth lines are received, the calculated partial sums are stored into line store 360 through mutiplexer 358. Finally, as the fifth line is received, the calculated partial sum for each sample in the line is output through multiplexer 380. While the top half of filter 350 is thus computing one output line, the bottom half of filter 350 is completing the computation of the previous output line, and beginning the computation of the next output line. Generally speaking, then, the output of filter 350 will be PS'[i]=x[i]+A[i](PS'[i−1]−x[i]) in accordance with equation 1 above.

The lower half of filter 350 is a mirror image of the upper half and contains analogous elements: adders 362 and 364, multiplier 366, multiplexer 368 and line store 370. Multiplier 366 has an associated coefficient B[i] and multiplexer 368 is controlled by a bit M(2). The setting of bit M(0) controls multiplexer 380 and determines whether the output y[i] will be from the upper portion or lower portion of filter 350.

The fact that televisions are interlaced means that twice the required pixel data is input to filter 350 as data samples x[i], when computer graphic data is being displayed on the television. This is because computer displays are typically non-interlaced, meaning they refresh all of the lines on the display during a refresh cycle. Therefore, data samples for all lines are input to filter 350. This means that twice the required data is input to filter 350, because an interlaced refresh cycle only updates half of the lines. As a result, the input data requires at least 2 to 1 vertical scaling, and if there is significant overscanning, then the scaling may be greater. Because the scaling is at least 2 to 1, however, half of the required line stores can be eliminated. In other words, if there are four lines, then four line stores would normally be required. But two of the lines are not needed as a result of the 2 to 1 scaling. Therefore, by recognizing that only half the lines are required and controlling M(1), M(2), and M(3) accordingly, two of the line stores, or half in general, can be eliminated. Thus, filter 350 greatly reduces the number of line stores required, and the line stores are the largest and costliest components of this filter.

Figure 10:
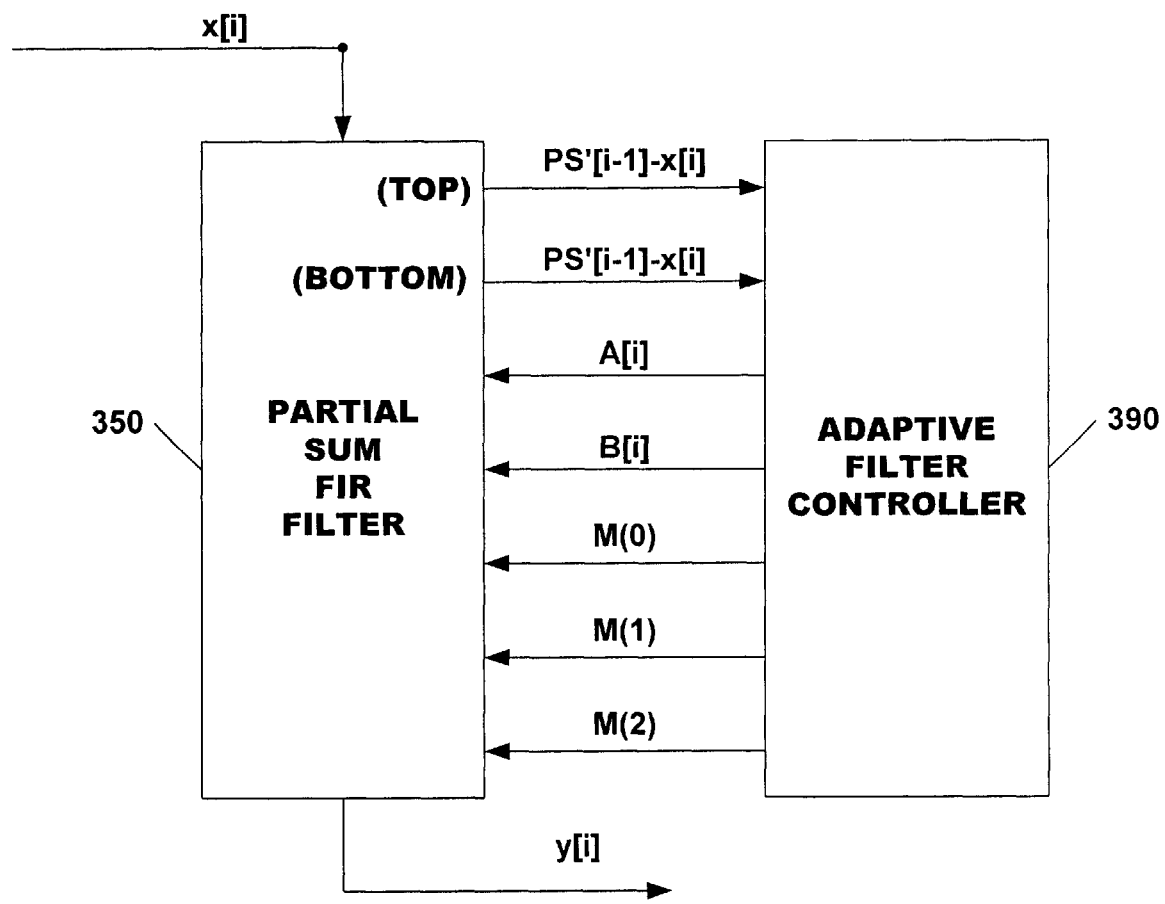
FIG. 10 is a block diagram of an adaptive filter controller according to the present invention.

As has been mentioned several times herein, significant variations between adjacent input samples can be problematic. In the context of a video signal, as described above, significant variations between vertically adjacent pixels can create "flicker". Flicker is a problem when displaying video graphic signals on a television, because televisions are interlaced. This means that only every other line is refreshed during a refresh cycle, with the remaining lines being refreshed during the next refresh cycle. The extra decay time that results due to the fact that each line is refreshed only every other refresh cycle can lead to even larger variations between adjacent vertical pixels making flicker even worse FIG. 10 illustrates an adaptive filter controller 390 for detecting and smoothing large variations between vertically and horizontally proximate pixels. Adaptive filter controller 390 communicates with filter 350 as indicated, and receives the difference between the previous partial sum and the current input sample from the output of adders 354 and 364. Thus controller 390 receives a difference from the top half of filter 350 and the bottom half of filter 350.

Line stores 360 and 370 store both actual input samples and partial sums. As adaptive filter controller generates the multiplexer control bits M(1) and M(2), controller 390 is able to maintain a record of what data is stored at what locations in the line stores. For vertical scaling, controller 390 uses the magnitude of the difference between the current input sample and the vertically adjacent partial sum from the previous line stored for the top and bottom halfs of filter 350 in line stores 360, 370. Based on these differences, controller 390 determines whether aggressive smoothing is necessary. In other words, based on these magnitudes, adjustments to coefficients A[i] and B[i] are made as necessary to provide appropriate smoothing for the corresponding output lines.

In one implementation, two sets of filter coefficients, sets c[i] and d[i] for example, may be created and stored for use by controller 390. One set can be used to aggressively smooth adjacent samples and one set can be used to smooth less aggressively. Coefficients c[i], for example, may provide more aggressive smoothing and coefficients d[i] may provide less aggressive smoothing. Therefore, if aggressive smoothing is required, then controller 390 can use coefficient set c[i] for coefficients A[i] and B[i]. As controller 390 provides the coefficients A[i] and B[i], it can easily switch these coefficients from the c[i] set to the d[i] set as is necessary to provide the appropriate smoothing based on the differences between the partial sums and the current input samples. Further adjustments to the coefficients may also be made based on the magnitude of the differences.

The algorithms and equations defining the operation of filter 350 and adaptive controller 390 may be implemented as a set of instructions (software or computer program code) that is carried out by a processor or controller to perform the filtering operation on incoming data samples. The processor may be a general-purpose microprocessor such as a PC microprocessor, a specialized DSP (Digital Signal Processor), or a combination of the two. The high computational speeds possible with DSPs make them ideal candidates for carrying out the mathematical operations and numerical processing associated with digital filters and controllers. Implementing the filter as a set of instructions carried out by a microprocessor is preferred since the filter will be easily programmable and can be changed or redesigned without changes in the circuitry or hardware. The use of microprocessors and computer program code to carry out the equations and algorithms defining filter 350 and controller 390 will be familiar to those of ordinary skill in the art.

Filter 350 and controller 390 may be implemented within a specialized video encoder, as described above, or alternatively, within a general-purpose computer system. Whether implemented in an encoder or in a computer system, the instructions, computer program code or software implementing the filter are carried out by the processor or DSP and may be stored in the processor itself or in an associated memory or storage device. The coefficients dictating filter operation will also be stored in the memory or storage device. The memory may take the form of ROM, RAM, disk storage or any other computer-readable and processor-decodable storage devices that are known to those of ordinary skill in the art. The processor or DSP may also receive instructions from an associated operating system.

Alternatively, filter 350 and controller 390 may be implemented as hardware, such as logic circuitry, or as a combination of hardware and software. The filter algorithm may be stored, for instance, as computer program code in memory and may direct an associated processor to carry out the filtering operation. The processor, in turn, may control and provide data to hardware elements (multipliers, adders, etc.) that carry out the filter algorithm.

Figure 11:
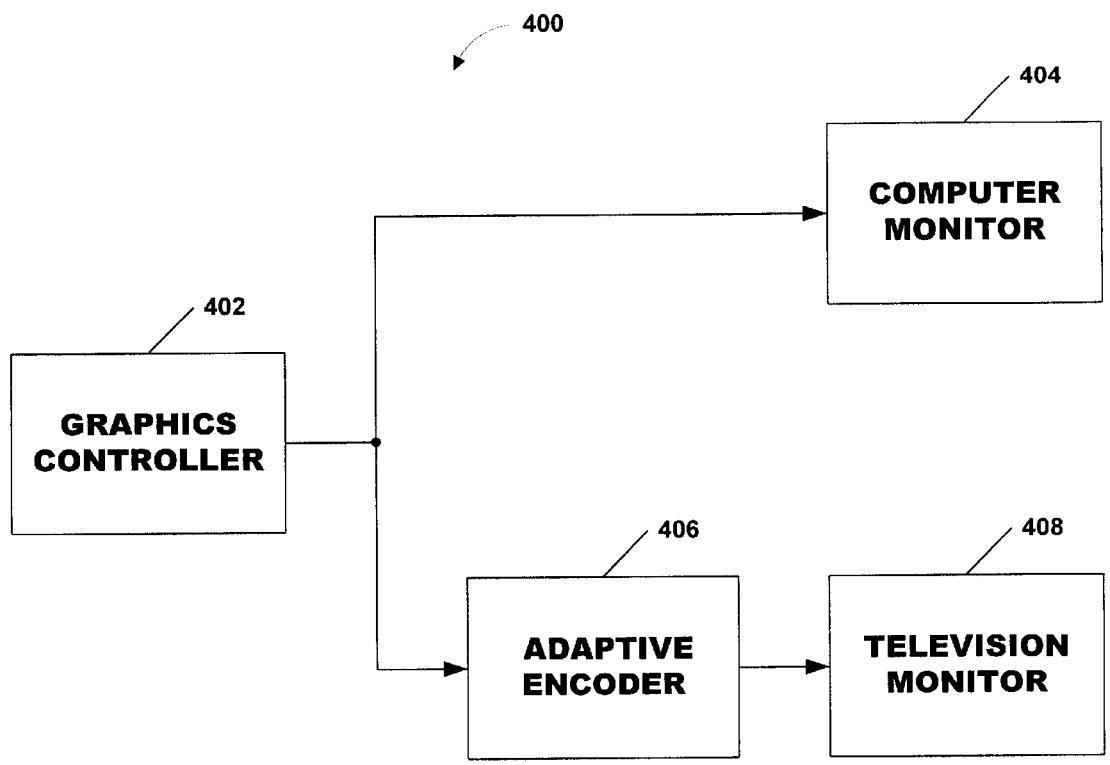
FIG. 11 is a block diagram of a video encoding system according to the present invention.

In one implementation, filter 350 and controller 390 are included in a video encoding system 400 (FIG. 11). System 400 comprises a computer graphics controller 402 that generates computer graphics display data for display on computer monitor 404. An adaptive encoder 406 also receives the computer graphics display data. Encoder 406 comprises a partial sum FIR filter and adaptive controller according to the present invention. Encoder 406 may comprise, for example, appropriate processor(s), computer program code, logic circuitry and/or memory implementing filter 350 and controller 390. Encoder 406 scales the graphics display data received from controller 402 for display on a television monitor 408.

Various embodiments of the present invention have been shown and described above. It should be understood, however, that these embodiments are presented by way of example only and not limitation. The partial sum digital FIR filter could be implemented, for example, in applications other than video encoding. The invention is defined by the following claims and their equivalents.

What is claimed is:

1. A digital filter, comprising:
   a plurality of stages, wherein each of the plurality of stages comprises:
   a first adder configured to subtract an input from a first partial sum producing a sum,
   a multiplier configured to multiply the sum by a gain coefficient producing a product, and
   a second adder configured to sum the product with the input to produce a second partial sum.

2. The digital filter of claim 1, wherein each stage comprises a delay element for storing the first partial sum for a predetermined period.

3. The digital filter of claim 1, wherein the gain coefficient is normalized.

4. The digital filter of claim 3, wherein the gain coefficient is normalized at least in part by dividing the gain for each of the plurality of stages by the total gain up to each of the plurality of stages.

5. The digital filter of claim 1, wherein the input is a data sample.

6. The digital filter of claim 1, wherein the input is an input line.

7. The digital filter of claim 1, wherein the digital filter is configured for n inputs, and wherein the digital filter comprises n−1 stages.

8. The digital filter of claim 1, wherein the digital filter is configured for n inputs, and wherein there are n/2 stages.

9. The digital filter of claim 1, wherein the gain coefficients are adjustable.

10. A digital filter, comprising:
    a plurality of stages, wherein each of the plurality of stages comprises:
    a first adder configured to subtract a first partial sum from an input producing a sum,
    a multiplier configured to multiply the sum by a gain coefficient producing a product, and
    a second adder configured to sum the product with the first partial sum to produce a second partial sum.

11. The digital filter of claim 10, wherein each stage comprises a delay element for storing the first partial sum for a predetermined period.

12. The digital filter of claim 10, wherein the gain coefficient is normalized.

13. The digital filter of claim 12, wherein the gain coefficient is normalized at least in part by dividing the gain for each of the plurality of stages by the total gain up to each of the plurality of stages.

14. An encoding system, comprising:
    a digital filter comprising a plurality of stages, each of the plurality of stages configured to receive a first partial sum and an input; and
    an adaptive filter configured to receive the difference between the first partial sum and the input for each of the plurality of stages, and to produce an adjustable gain coefficient for use by each of the plurality of stages based on the difference between the first partial sums and the inputs.

15. The encoding system of claim 14, wherein the adjustable gain coefficients are produced from predetermined sets of gain coefficients.

16. The encoding system of claim 15, wherein the predetermined sets of gain coefficients comprises one set for more aggressive filtering and one set for less aggressive filtering.

17. A digital filter, comprising:
    a plurality of stages, wherein each of the plurality of stages comprises:
    a means for subtracting an input from a first partial sum producing a sum,
    a means for multiplying the sum by a gain coefficient producing a product, and
    a means for summing the product with the input to produce a second partial sum.

18. The digital filter of claim 17, comprising a means for delaying the first partial sum for a predetermined period.

19. The digital filter of claim 18, comprising a means for normalizing the gain coefficient.

20. A method for digital filtering, comprising:
    subtracting an input from a first partial sum producing a sum,
    multiplying the sum by a gain coefficient producing a product, and
    summing the product with the input to produce a second partial sum.

21. The method of claim 20, comprising delaying the first partial sum for a predetermined period.

22. The method of claim 21, comprising normalizing the gain coefficient.

* * * * *